US012225743B2

(12) United States Patent
Xu et al.

(10) Patent No.: US 12,225,743 B2
(45) Date of Patent: Feb. 11, 2025

(54) LONG-ACTING AND STABLE PEROVSKITE SOLAR CELL AND PREPARATION METHOD THEREOF

(71) Applicant: Nanjing University of Posts & Telecommunications, Nanjing (CN)

(72) Inventors: Ligang Xu, Nanjing (CN); Wenxuan Lv, Nanjing (CN); Runfeng Chen, Nanjing (CN); Wei Huang, Nanjing (CN)

(73) Assignee: Nanjing University of Posts & Telecommunications, Nanjing (CN)

( * ) Notice: Subject to any disclaimer, the term of this patent is extended or adjusted under 35 U.S.C. 154(b) by 0 days.

(21) Appl. No.: 18/818,668

(22) Filed: Aug. 29, 2024

(65) Prior Publication Data

US 2024/0423000 A1     Dec. 19, 2024

Related U.S. Application Data

(63) Continuation of application No. PCT/CN2023/135366, filed on Nov. 30, 2023.

(30) Foreign Application Priority Data

Feb. 28, 2023   (CN) .......................... 202310178293.1

(51) Int. Cl.
   *H01L 31/044*   (2014.01)
   *H10K 30/40*    (2023.01)
   *H10K 30/88*    (2023.01)

(52) U.S. Cl.
   CPC ............. *H10K 30/88* (2023.02); *H10K 30/40* (2023.02)

(58) Field of Classification Search
   CPC ...... H01L 31/00–078; Y02E 10/50–60; H10K 30/00–89

(Continued)

(56) References Cited

FOREIGN PATENT DOCUMENTS

| CN | 106856223 A | 6/2017 |
| CN | 112216799   | * 1/2021 |
| CN | 113871536 A | 12/2021 |

OTHER PUBLICATIONS

Lv et al., Constructing Soft Perovskite-Substrate Interfaces for Dynamic Modulation of Perovskite Film in Inverted Solar Cells with Over 6200 Hours Photostability, Adv. Sci., 2022, 9, 2202028 (Year: 2022).*

(Continued)

*Primary Examiner* — Bach T Dinh
(74) *Attorney, Agent, or Firm* — Hemisphere Law, PLLC; Zhigang Ma

(57) ABSTRACT

A long-lasting and stable perovskite solar cell utilizes fluorine-containing inorganic ammonium salts to form ion exchange with perovskite to construct a perovskite light-absorbing layer to protect the perovskite, greatly improving stability of the perovskite solar cell. The perovskite solar cell can maintain 94% and 81% of its initial efficiency after being placed in a nitrogen-filled glove box and humid air for 14,016 hours and 2,500 hours, respectively, and can still maintain 83% of its initial efficiency after performed by heat aging at 85° C. for 1,248 hours, reaching a world-class level. A preparation method of the perovskite solar cell is simple, materials used to prepare the perovskite solar cell are inexpensive, and the stability of an obtained device is significantly improved under various conditions.

3 Claims, 11 Drawing Sheets

(58) Field of Classification Search
USPC .................................................. 136/243–265
See application file for complete search history.

(56) References Cited

OTHER PUBLICATIONS

CN112216799 English (Year: 2020).*
CNIPA, Notification of First Office Action for CN202310178293.1, May 15, 2024.
Nanjing University of Posts and Telecommunications (Applicant), Replacement claims (allowed) of CN202310178293.1, Jun. 27, 2024.
CNIPA, Notification to grant patent right for invention in CN202310178293.1, Jul. 8, 2024.

* cited by examiner

LONG-ACTING AND STABLE PEROVSKITE SOLAR CELL AND PREPARATION METHOD THEREOF

CROSS-REFERENCE TO RELATED APPLICATION

This application claims priority to a Chinese patent application No. 202310178293.1, filed to China National Intellectual Property Administration (CNIPA) on Feb. 28, 2023, which is herein incorporated by reference in its entirety.

TECHNICAL FIELD

The present disclosure relates to the technical field of perovskite solar cells (PSCs), particularly to a long-acting and stable PSC and a preparation method thereof.

BACKGROUND

With the development of society, environmental pollution, resource shortage, etc. have become problems to be urgently solved, and solar energy has become an important development object due to the advantages of being clean and renewable, inexhaustible, cheap, and easy to obtain. At the same time, in recent years, hybrid organic-inorganic metal-halide perovskite (HOIP) materials have excellent properties such as a high absorption coefficient, an adjustable bandgap, a low exciton binding energy, a long carrier diffusion length, etc., which could be applied to the photovoltaic field. Therefore, the perovskite solar cells (PSCs) with easy preparation and low-cost have been studied widely. Moreover, the PSCs have improved their power conversion efficiency (PCE) from 3.8% to 26.1% over a short decade, which can be comparable to commercialized silicon cells.

While the PCE of the PSCs has reached a commercial level, its poor stability still hinders its commercialization process. Since the organic components and the inorganic components in a perovskite crystal structure are combined by weak van der Waals interactions and hydrogen bonds, the perovskite has poor chemical stability and is easily decomposed under the stimulation of water, oxygen, high temperature, etc. Specifically, when the perovskite is exposed to moisture, the water therein binds to methylammonium ($MA^+$) in the perovskite to destroy a network formed by the $MA^+$ and lead(II) iodide ($PbI_2$), causing the perovskite to decompose. After the oxygen enters the perovskite crystal lattice, photo-generated electrons are captured to generate an active superoxide $O_2^-$, which causes deprotonation of the $MA^+$ and accelerates the decomposition of the perovskite. In addition, the organic components in the perovskite, such as the MA, are easy to volatilize or migrate at high temperature to generate defects or holes, thereby causing the decomposition of the perovskite. Moreover, the instability of the perovskite will eventually lead to instability of the whole solar cell and cannot reach the expected service lifetime. Therefore, an urgent challenge is to block external water and oxygen from penetrating the perovskite crystal lattice while simultaneously stabilizing organic ions (such as $MA^+$) within the perovskite structure. Addressing this issue is crucial for enhancing the overall stability of the perovskite and, consequently, the entire solar cell.

Component engineering is a common method for improving the stability of PSCs. By completely or partially replacing one or more components in the perovskite, the ions inside the perovskite are "fixed" with a stronger acting force, and thus improving the stability of the perovskite. However, due to its inherent limitations, component engineering struggles to effectively block the permeation of external water and oxygen. As a result, it cannot significantly enhance the stability of the device in air and primarily improves only its thermal stability. Moreover, component engineering, which involves simple component replacement by those skilled in the field, often leads to an unstable crystal structure due to mismatched ionic radii. This mismatch is detrimental to the long-term stability of the solar cell. Interface engineering is another common method for improving the stability of PSCs. Grdtzel et al., "*Tailored Amphiphilic Molecular Mitigators for Stable Perovskite Solar Cells with 23.5% Efficiency*", Advanced Materials, March 2020, pp. 1907757, Volume 32, No. 12, use the 4-tert-butyl-benzylammonium iodide (tBBAI) as a hydrophobic intermediate layer to protect the perovskite from ambient moisture, so as to enhance the stability of the device in the air. Although the common component engineering and interface engineering can improve the stability of the device to a certain extent, it is only possible to improve the stability under a certain condition, such as in the air or under the high temperature, which cannot be improved simultaneously. Therefore, in view of this problem, how to improve the stability of the solar cell under various conditions by protecting the perovskite has become one of the problems to be solved urgently at present.

SUMMARY

Objectives of the present disclosure are to summarize some aspects of embodiments of the present disclosure and to briefly introduce some illustrated embodiments of the present disclosure. Some simplifications or omissions may be made in this part and the abstract and title of the present disclosure to avoid obscuring the objectives of this part, the abstract, and the title of the present disclosure. However, the simplifications or the omissions are not intended to limit the scope of the present disclosure.

In view of the above problems and/or problems existing in the related art, the present disclosure is proposed.

Therefore, an objective of the present disclosure is to overcome the defects in the related art and provide a long-acting and stable perovskite solar cell (PSC).

In order to solve the above technical problem, the present disclosure provides the following technical solutions.

A structure of the PSC (also referred to the long-acting and stable PSC) includes a substrate, an anode layer, a hole-transporting layer, a perovskite multi-protective layer, a composite electron-transporting layer, a hole blocking layer, and a metal cathode layer that are arranged sequentially from bottom to top of the structure of the PSC; and the perovskite multi-protective layer includes: a perovskite light-absorbing layer and a multifunctional protection layer.

In a technical solution of the long-acting and stable PSC of the present disclosure, the perovskite light-absorbing layer is of a two-layer structure with a thickness of 100 nanometers (nm) to 400 nm; a lower layer of the two-layer structure is an original perovskite crystal with a composition of $(Cs_{0.05}FA_{0.81}MA_{0.14})Pb(Br_{0.14}I_{0.86})_3$, an upper layer of the two-layer structure is an ion-exchanged perovskite crystal with a composition of $(Cs_{0.05}FA_{0.81}MA_{0.14})Pb(Br_{0.14}I_{0.86-x}(PF_6)_x)_3$, and the multifunctional protection layer is made from ammonium hexafluorophosphate ($NH_4PF_6$).

In a technical solution of the long-acting and stable PSC of the present disclosure, the perovskite multi-protective layer is configured to improve a stability of the PSC through triple protection, and the triple protection includes: an ion exchange reaction, a hydrophobic effect and hydrogen bonding based on raw materials of the PSC, and passivation of perovskite defects.

In a technical solution of the long-acting and stable PSC of the present disclosure, the composite electron-transporting layer is of a two-layer structure with a thickness of 30 nm to 50 nm; and a lower layer of the two-layer structure is a [6,6]-phenyl C61 butyric acid methyl ester ($PC_{61}BM$) layer, and an upper layer of the two-layer structure is fullerene ($C_{60}$).

In a technical solution of the long-acting and stable PSC of the present disclosure, the substrate is made of transparent glass, the anode layer is made of indium tin oxide (ITO), the hole-transporting layer is made from poly[bis(4-phenyl)(2, 4,6-trimethylphenyl)amine](PTAA), the hole blocking layer is made from lithium fluoride (LiF), and the metal cathode layer is made of a metal, such as copper (Cu), aluminium (Al), silver (Ag) or gold (Au); a thickness of the hole-transporting layer is in a range of 15 nm to 30 nm, a thickness of the hole blocking layer is 1 nm, and a thickness of the metal cathode layer is 100 nm.

Another objective of the present disclosure is to overcome the defects in the related art and provide a preparation method of the long-acting and stable PSC.

In order to solve the above technical problem, the present disclosure provides the following technical solutions.

The preparation method of the PSC includes the following steps: preparing the anode layer on the substrate by using transparent glass as the substrate, and spin-coating a poly [bis(4-phenyl)(2,4,6-trimethylphenyl)amine] (PTAA) solution on the anode layer to obtain the hole-transporting layer; spin-coating a perovskite precursor solution on the hole-transporting layer by using an one-step anti-solvent method; dropwise adding an anti-solvent of ethyl acetate (EA) containing the $NH_4PF_6$ during spin-coating the perovskite precursor solution, placing the hole-transporting layer coated with the perovskite precursor solution on a heating stage for an annealing reaction after finishing spin-coating the perovskite precursor solution, and obtaining the perovskite multi-protective layer after the annealing reaction is finished.

Specially, a lower portion of the perovskite multi-protective layer is a perovskite crystal with a composition of $(Cs_{0.05}FA_{0.81}MA_{0.14})Pb(Br_{0.14}I_{0.86})_3$ and an upper portion of the perovskite multi-protective layer is an ion-exchanged perovskite crystal with a composition of $(Cs_{0.05}FA_{0.81}MA_{0.14})Pb(Br_{0.14}I_{0.86-x}(PF_6)_x)_3$ that together constitute the perovskite light-absorbing layer of the perovskite multi-protective layer, and a top surface of the perovskite multi-protective layer is the multifunctional protection layer made from the $NH_4PF_6$.

Furthermore, the preparation method of the PSC further includes: spin-coating a [6,6]-phenyl C61 butyric acid methyl ester ($PC_{61}BM$) solution on the multifunctional protection layer to obtain a $PC_{61}BM$ layer, and then depositing fullerene ($C_{60}$) on the $PC_{61}BM$ layer to construct the composite electron-transporting layer.

Specially, a lower layer of the composite electron-transporting layer is the $PC_{61}BM$ layer, and an upper layer of the composite electron-transporting layer is the $C_{60}$.

Moreover, the preparation method of the PSC further includes: evaporating lithium fluoride (LiF) on the composite electron-transporting layer as the hole blocking layer, and then evaporating a metal material on the hole blocking layer to form the metal cathode layer, thereby obtaining the PSC.

In a technical solution of the long-acting and stable PSC of the present disclosure, the perovskite precursor solution is prepared by dissolving formamidinium iodide (FAI), methylammonium bromide (MABr), lead(II) bromide ($PbBr_2$), and lead(II) iodide ($PbI_2$) in a mixed solvent of N,N-dimethylformamide (DMF) and dimethyl sulfoxide (DMSO) with a volume ratio of the DMF to the DMSO being 4:1 to obtain a first mixed solution, then dissolving cesium iodide (CsI) in DMSO to obtain a second mixed solution, and mixing the first mixed solution and the second mixed solution before spin-coating the perovskite precursor solution; and a speed of spin-coating the perovskite precursor solution is in a range of 5,000 revolutions per minute (rpm) to 10,000 rpm, and a time for spin-coating the perovskite precursor solution is 55 seconds (s).

In a technical solution of the long-acting and stable PSC of the present disclosure, a concentration of the $NH_4PF_6$ in the anti-solvent of EA containing $NH_4PF_6$ is in a range of 0.2 milligrams per milliliter (mg/mL) to 10 mg/mL, the dropwise adding is performed during spin-coating the perovskite precursor solution, a time for dropwise adding the anti-solvent of EA containing the $NH_4PF_6$ is 15 s before finishing spin-coating the perovskite precursor solution, and an addition amount of the anti-solvent of EA is in a range of 100 microliters (µL) to 250 µL.

In a technical solution of the long-acting and stable PSC of the present disclosure, a reaction temperature for the annealing reaction is in a range of 70 degrees Celsius (° C.) to 120° C., and a reaction time for the annealing reaction is in a range of 5 min to 20 min.

In a technical solution of the long-acting and stable PSC of the present disclosure, the PSC is capable of maintaining long-term stability under various conditions, maintaining 94% and 81% of an initial efficiency of the PSC after being placed in a nitrogen-filled glove box and humid air for 14,016 hours (h) and 2,500 h, respectively, and maintaining 83% of the initial efficiency of the PSC after performed by heat aging at 85° C. for 1,248 h.

The present disclosure has the following beneficial effects.

(1) In the present disclosure, by adding the $NH_4PF_6$ into the anti-solvent, the self-protective perovskite light-absorbing layer is formed with a structure of original perovskite/ion-exchanged perovskite/$NH_4PF_6$ in-situ protective layer, which protects a perovskite film through the triple protection, thereby significantly improving the stability of the device under various conditions, such as the glove box, the air, and the heat aging.

(2) The PSC prepared by the present disclosure has long-acting stability under various conditions. Moreover, the PSC can still maintain 94% and 81% of the initial efficiency thereof after being placed in the nitrogen-filled glove box and the humid air respectively for 14,016 h and 2,500 h, and can also still maintain 83% of the initial efficiency thereof after performed by the heat aging at 85° C. for 1,248 h.

(3) Compared with the related art, the preparation process of the present disclosure is simple, the materials used in the present disclosure are low in price, the stability of the final device under various conditions is significantly improved, the world-class level is reached, and the PCE is significantly improved.

BRIEF DESCRIPTION OF DRAWINGS

In order to more clearly illustrate the technical solutions of the embodiments of the present disclosure, attached drawings required in the description of the embodiments will be briefly described below. Apparently, the attached drawings in the following description merely illustrate some embodiments of the present disclosure, and for those skilled in the related art, other drawings may be obtained according to the attached drawings without creative efforts.

DETAILED DESCRIPTION OF EMBODIMENTS

In order to make the above objectives, features and advantages of the present disclosure more comprehensible, a specific implementation manner of the present disclosure is described in detail below with reference to the illustrated embodiments described in the present disclosure.

Many details are set forth in the following description in order to fully understand the present disclosure, but the present disclosure may also be implemented in other manners different from those described herein, and those skilled in the related art may make similar promotion without departing from the connotation of the present disclosure, and therefore, the present disclosure is not limited by the illustrated embodiments disclosed below.

In addition, "an embodiment" or "the embodiment" described herein refers to a particular feature, structure, or characteristic that may be included in at least one implementation manner of the present disclosure. The appearances of the phrase "in an embodiment" in various places throughout the present disclosure are not all referring to the same embodiment, nor are separate or selective embodiments mutually exclusive of other embodiments.

Raw materials used in the present disclosure are all commercially available without special description.

Full names and abbreviations of chemicals involved in the present disclosure are as follows:

| Abbreviation | Full name |
| --- | --- |
| PTAA | Poly[bis(4-phenyl)(2,4,6-trimethylphenyl)amine] |
| $NH_4PF_6$ | Ammonium hexafluorophosphate |
| FAI | Formamidinium iodide |
| MABr | Methylammonium bromide |
| $PbBr_2$ | Lead(II) bromide |
| $PbI_2$ | Lead(II) iodide |
| $PC_{61}BM$ | [6,6]-Phenyl C61 butyric acid methyl ester |
| $C_{60}$ | Fullerene |
| LiF | Lithium fluoride |
| Cu | Copper |
| DMF | N,N-dimethylformamide |
| DMSO | Dimethyl sulfoxide |
| Tol | Toluene |
| CB | Chlorobenzene |
| EA | Ethyl acetate |
| Eth | Ethanol |

Embodiment 1

Figure 1:
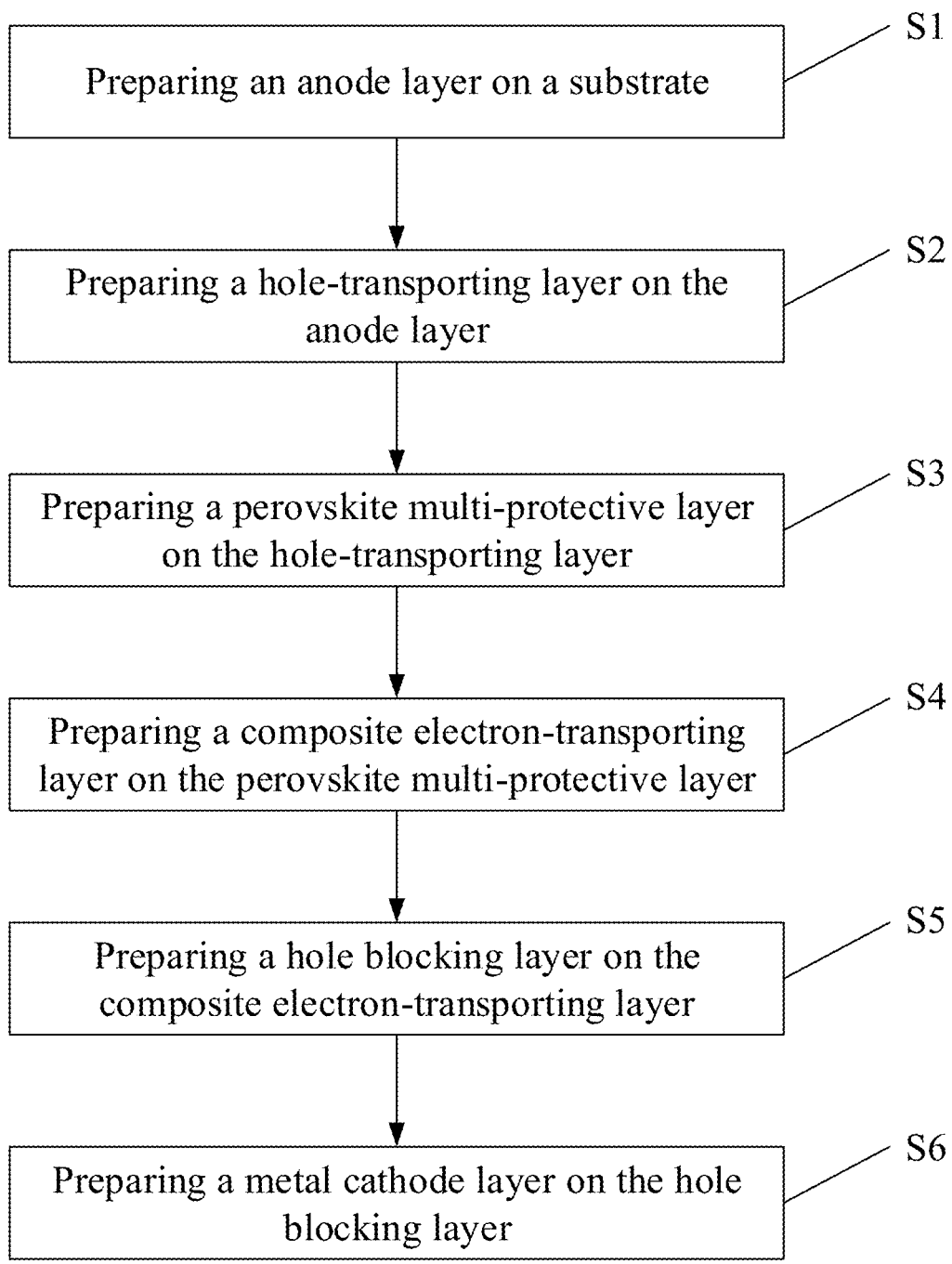
FIG. 1 illustrates a preparation process of a long-acting and stable perovskite solar cell (PSC) according to the present disclosure.
Figure 2:
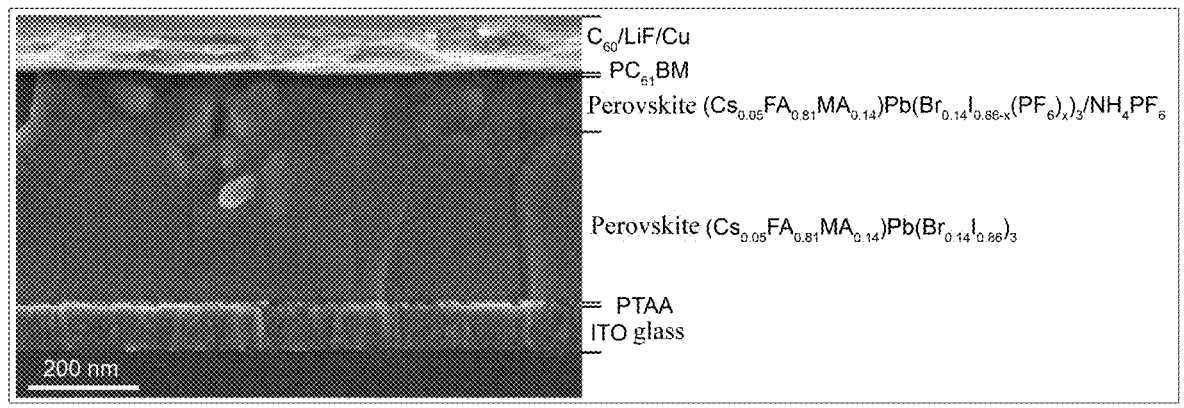
FIG. 2 illustrates a cross-sectional morphology of a PSC prepared in an embodiment 1 according to the present disclosure by using a scanning electron microscope (SEM).

With reference to FIGS. 1-2, a schematic diagram of a preparation process of a long-acting and stable PSC according to the present disclosure is provided. The present embodiment provides a preparation method of the PSC.

Step 1: transparent glass is used as a substrate and an anode layer is formed on the substrate. Specially, the anode layer is a transparent electrode and is made of ITO.

The ITO conductive glass is ultrasonically cleaned with ITO lotion, deionized water, acetone and ethanol successively, then dried in an oven at 100° C. for 10 min, and finally cleaned with ultraviolet ozone for 15 min to obtain the transparent anode layer.

Step 2: a hole-transporting layer is prepared on the anode layer.

In an illustrated embodiment, the hole-transporting layer is made from the PTAA.

The PTAA is dissolved in TOL to prepare a solution with a concentration of 4 mg/mL for spin coating, the PTAA solution is spin-coated on the anode layer by using a homogenizer, and the spin-coating is performed at a speed of 4,000 rpm for 30 s, and then an annealing reaction is performed at 100° C. for 10 min after the spin coating is finished, to obtain the hole-transporting layer.

Step 3: a self-protective perovskite light-absorbing layer (also referred to a perovskite light-absorbing layer) and a multifunctional protection layer are prepared on the hole-transporting layer by using a one-step anti-solvent method.

In an illustrated embodiment, the self-protective perovskite light-absorbing layer is of a two-layer structure with a thickness of 100-400 nm; a lower layer of the two-layer structure is a perovskite crystal with a composition of $(Cs_{0.05}FA_{0.81}MA_{0.14})Pb(Br_{0.14}I_{0.86})_3$, an upper layer of the two-layer structure is an ion-exchanged perovskite crystal with a composition of $(Cs_{0.05}FA_{0.81}MA_{0.14})Pb(Br_{0.14}I_{0.86-x}(PF_6)_x)_3$, and the multifunctional protection layer is made from $NH_4PF_6$.

Specially, 228.072 mg of FAI, 26.208 mg of MABr, 92.484 mg of $PbBr_2$, and 648.072 mg of $PbI_2$ are dissolved in 1.2 mL of a mixed solvent of DMF and DMSO at a volume ratio of the DMF to the DMSO being 4:1 to prepare the perovskite precursor solution with a concentration of 1.38 molarity (abbreviated as M with a unit of mole per liter abbreviated as mol/L); and 389.7 mg of CsI is dissolved in DMSO, and 54.8 μL of the DMSO dissolved with the CsI is added into the perovskite precursor solution before spin-coating the perovskite precursor solution.

In addition, the $NH_4PF_6$ is dissolved in the anti-solvent of EA, and then the anti-solvent of EA dissolved with the $NH_4PF_6$ is stirred for 12 h to obtain a solution with a concentration of 1 mg/mL.

The perovskite precursor solution is spin-coated on the hole-transporting layer at a rotational speed of 10,000 rpm for 55 s; and 150 μL of the anti-solvent of EA dissolved with the $NH_4PF_6$ is slowly dropwise added at a constant speed when the perovskite precursor solution is spin-coated for 40 s to promote a rapid nucleation of the perovskite and trigger an ion exchange reaction.

After the perovskite precursor solution is spin-coated over, an annealing reaction is performed on the hole-transporting layer coated with the perovskite precursor solution at 100° C. for 10 min. At this time, the ion exchange reaction continues, and after the annealing reaction finishes, the self-protective perovskite light-absorbing layer and the multifunctional protection layer are obtained. Specially, the lower portion of the perovskite multi-protective layer is an original perovskite crystal with a composition of $(Cs_{0.05}FA_{0.81}MA_{0.14})Pb(Br_{0.14}I_{0.86})_3$, an upper portion of the perovskite multi-protective layer is an ion-exchanged perovskite crystal with a composition of $(Cs_{0.05}FA_{0.81}MA_{0.14})Pb(Br_{0.14}I_{0.86-x}(PF_6)_x)_3$, and a top surface of the perovskite multi-protective layer is the multifunctional protection layer of $NH_4PF_6$.

Step 4: a composite electron-transporting layer is prepared on the multifunctional protection layer of the perovskite multi-protective layer.

In an illustrated embodiment, the composite electron-transporting layer is made from the $PC_{61}BM$ and the $C_{60}$.

Specially, the $PC_{61}BM$ is dissolved in the CB to prepare a $PC_{61}BM$ solution with a concentration of 20 mg/mL for spin-coating an electron-transporting layer with a speed of 2,000 rpm for 1 min to form a $PC_{61}BM$ layer.

Then, the composite electron-transporting layer is constructed by depositing the $C_{60}$ on the $PC_{61}BM$ layer by using a vacuum evaporation device. Specially, an evaporation rate for the $C_{60}$ is 0.6 angstrom per second (Å/s), and the vapor deposition process ensures that the air pressure environment is less than $5\times10^{-4}$ Pascal (Pa), and the composite electron-transporting layer is obtained after the vapor deposition is completed.

Step 5: a hole blocking layer is prepared on the composite electron-transporting layer.

Further, the hole blocking layer is made from the LiF.

LiF is evaporated on the composite electron-transporting layer to serve as the hole blocking layer, an evaporation rate for the LiF is 0.08 Å/s, the vapor deposition process ensures that the air pressure environment is less than $5\times10^{-4}$ Pa, and after the vapor deposition is completed, the hole blocking layer is obtained.

Step 6: a metal cathode layer is prepared on the hole blocking layer.

Further, the metal cathode layer is made from a metal copper (Cu).

The metal Cu is evaporated on the hole blocking layer by using a vacuum evaporation device to form the metal cathode layer. Specially, an evaporation rate for the metal Cu is 15 Å/s, the vapor deposition process ensures that the air pressure environment is less than $5\times10^{-4}$ Pa, and after the vapor deposition is completed, the metal cathode layer is obtained.

In the PSC prepared above, a thickness of the substrate is 1-2 mm, a thickness of the anode layer is 80-110 nm, a thickness of the hole-transporting layer is 15-30 nm, a thickness of the perovskite multi-protective layer is 100-400 nm, a thickness of the composite electron-transporting layer is 30-50 nm, a thickness of the hole blocking layer is 1 nm, and a thickness of the metal cathode layer is 100 nm.

With reference to FIG. 2, it illustrates the cross-sectional morphology of the PSC prepared in the embodiment 1 of the present disclosure. It can be seen that, according to the present disclosure, the $NH_4PF_6$ is added into the anti-solvent, and then the anti-solvent containing the $NH_4PF_6$ is added dropwise during the spin-coating process of the perovskite precursor solution, and since a radius of the hexafluorophosphate ($PF_6^-$) is similar to that of an iodine ion ($I^-$) in the perovskite, the self-protective perovskite light-absorbing layer with multiple protection can be formed by ion exchange during the spin-coating process and the annealing reaction.

On the one hand, the perovskite multi-protective layer can block the infiltration of external moisture through its own hydrophobicity, and on the other hand, it can form hydrogen bonds with a methylammonium ion ($MA^+$) in the perovskite to suppress the volatilization of $MA^+$ at a high temperature. In addition, the perovskite multi-protective layer can anchor an uncoordinated lead ion ($Pb^{2+}$) in the perovskite, realize the passivation of defects, and form a low-defect high-quality perovskite film, thereby greatly improving the stability of the PSC through the triple protection.

Embodiment 2

With reference to FIGS. 3-10, in order to verify the beneficial effects of the present disclosure, the present embodiment provides a preparation method of a PSC without multiple protections. Moreover, the PSC prepared in the present embodiment is compared and tested with the PSC prepared in the embodiment 1, and test results are compared by means of scientific demonstration to verify the real effects of the preparation method provided by the present disclosure.

The present embodiment differs from the embodiment 1 in that the step 3 is adjusted. Specially, no material is added to the anti-solvent of EA to prepare the self-protective perovskite light-absorbing layer, and the prepared self-protective perovskite light-absorbing layer is composed of $(Cs_{0.05}FA_{0.81}MA_{0.14})Pb(Br_{0.14}I_{0.86})_3$, and there is no ion-exchanged perovskite, nor a perovskite multi-protective layer.

The remaining steps and the preparation process in the present embodiment are the same as those in the embodiment 1 to prepare the PSC.

The performance of the prepared PSC is compared with that of the PSC prepared in the embodiment 1, and the results are shown in the following Table 1 and FIG. 3.

Table 1 shows a performance comparison table of the PSC without the perovskite multi-protective layer.

|  | $V_{oc}/V$ | $J_{sc}/mA\ cm^{-2}$ | FF/% | PCE/% |
|---|---|---|---|---|
| Standard device | 1.10 | 20.86 | 74.33 | 17.04 |
| $NH_4PF_6$ | 1.13 | 21.46 | 79.04 | 19.08 |

Figure 3:
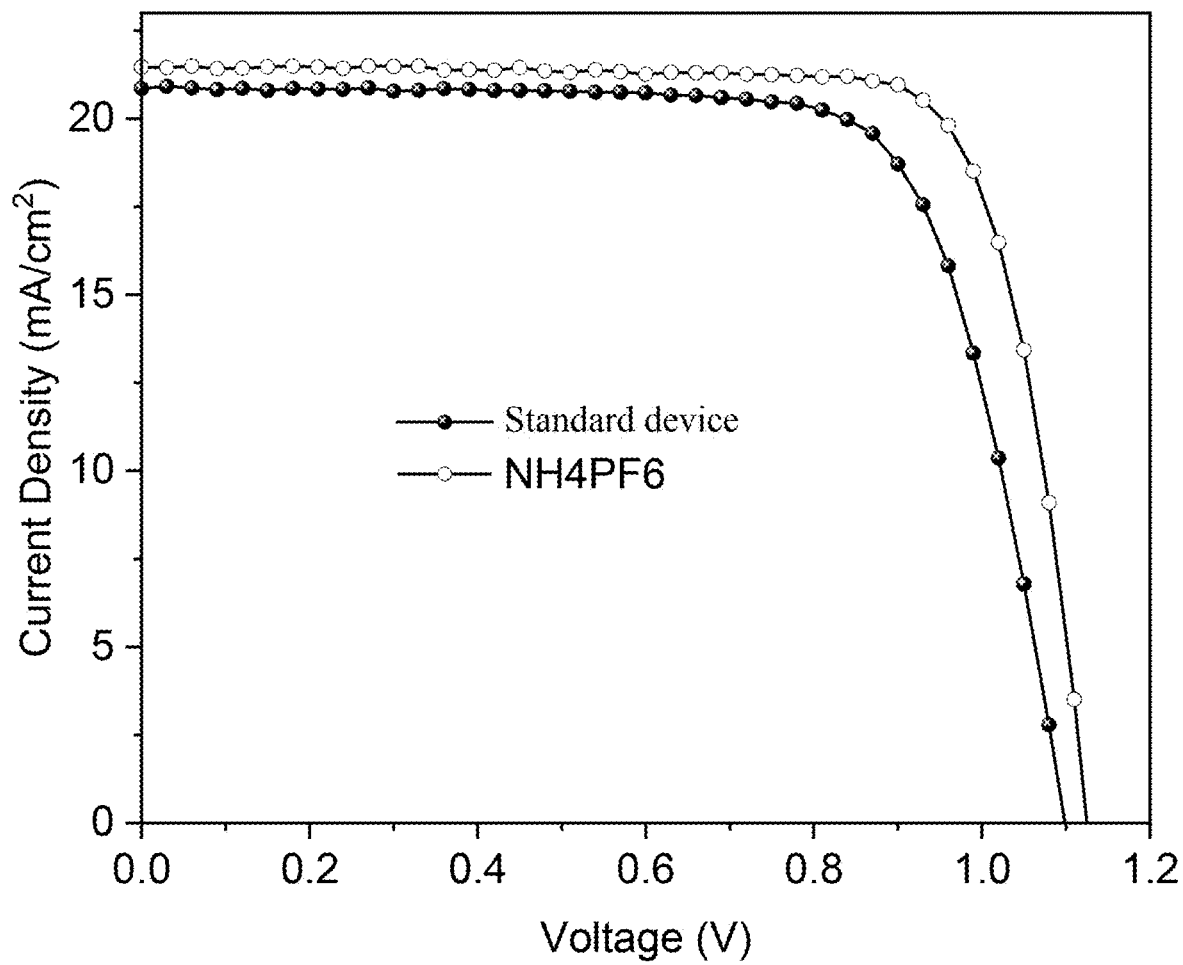
FIG. 3 illustrates a schematic diagram of current density-voltage (J-V) curves of PSCs prepared in the embodiment 1 and an embodiment 2 according to the present disclosure.

FIG. 3 illustrates J-V curves of the PSCs prepared in the embodiment 1 and the embodiment 2, and it can be seen from the above Table 1 and FIG. 3 that the PCE of the PSC can be obviously improved after the $NH_4PF_6$ is added into the anti-solvent of EA.

Figure 4:
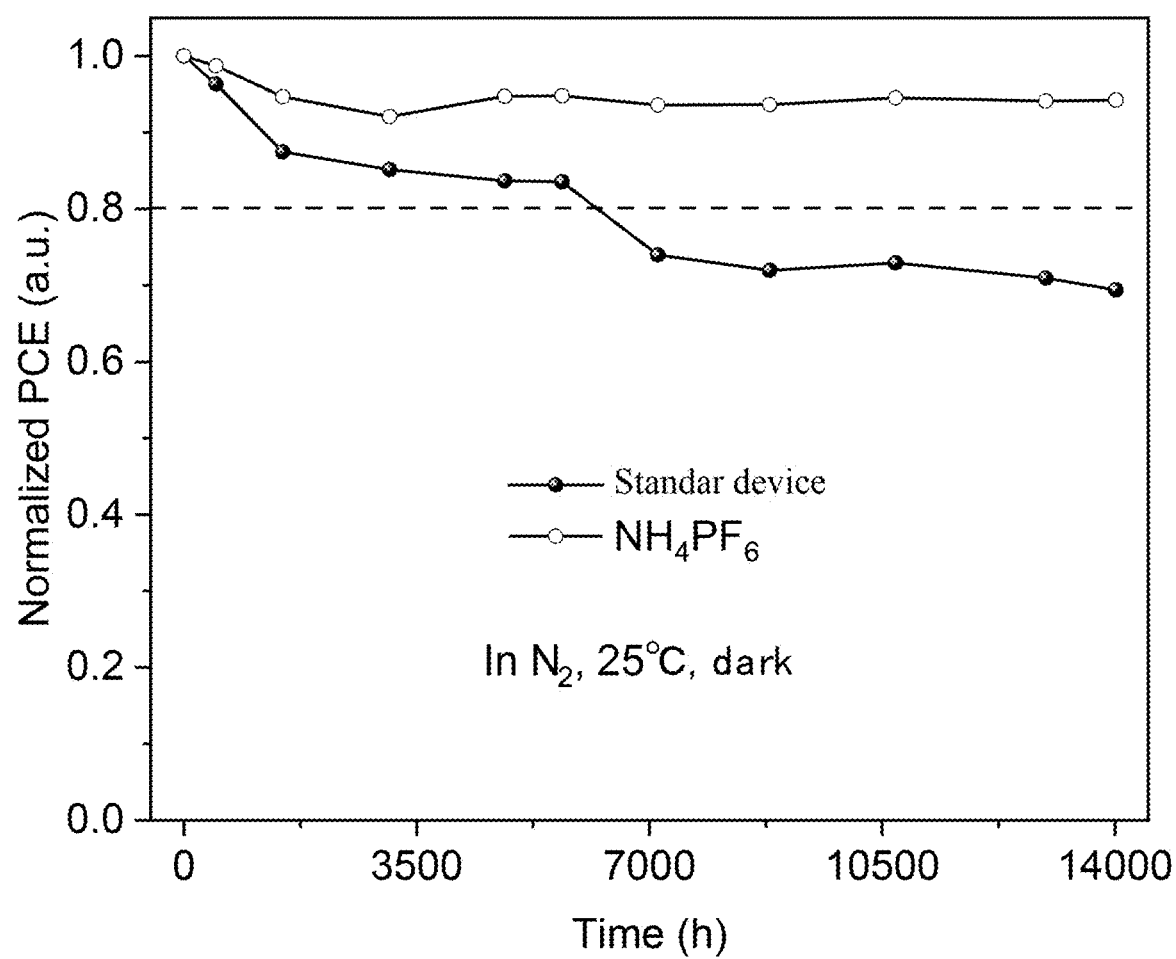
FIG. 4 illustrates a schematic diagram of stability variation curves of the PSCs prepared in the embodiment 1 and an embodiment 2 according to the present disclosure when stored in glove boxes.

With reference to FIG. 4, it illustrates stability variation curves of the PSCs prepared in the embodiment 1 and an embodiment 2 according to the present disclosure when stored in glove boxes filled with nitrogen ($N_2$). Furthermore, it can be seen that after placing 14,016 hours (584 days), the PSC with the perovskite multi-protective layer can still maintain 94% of the initial efficiency of the PSC, while the PSC prepared in the embodiment 2 only remains 69% of the initial efficiency.

Figure 5:
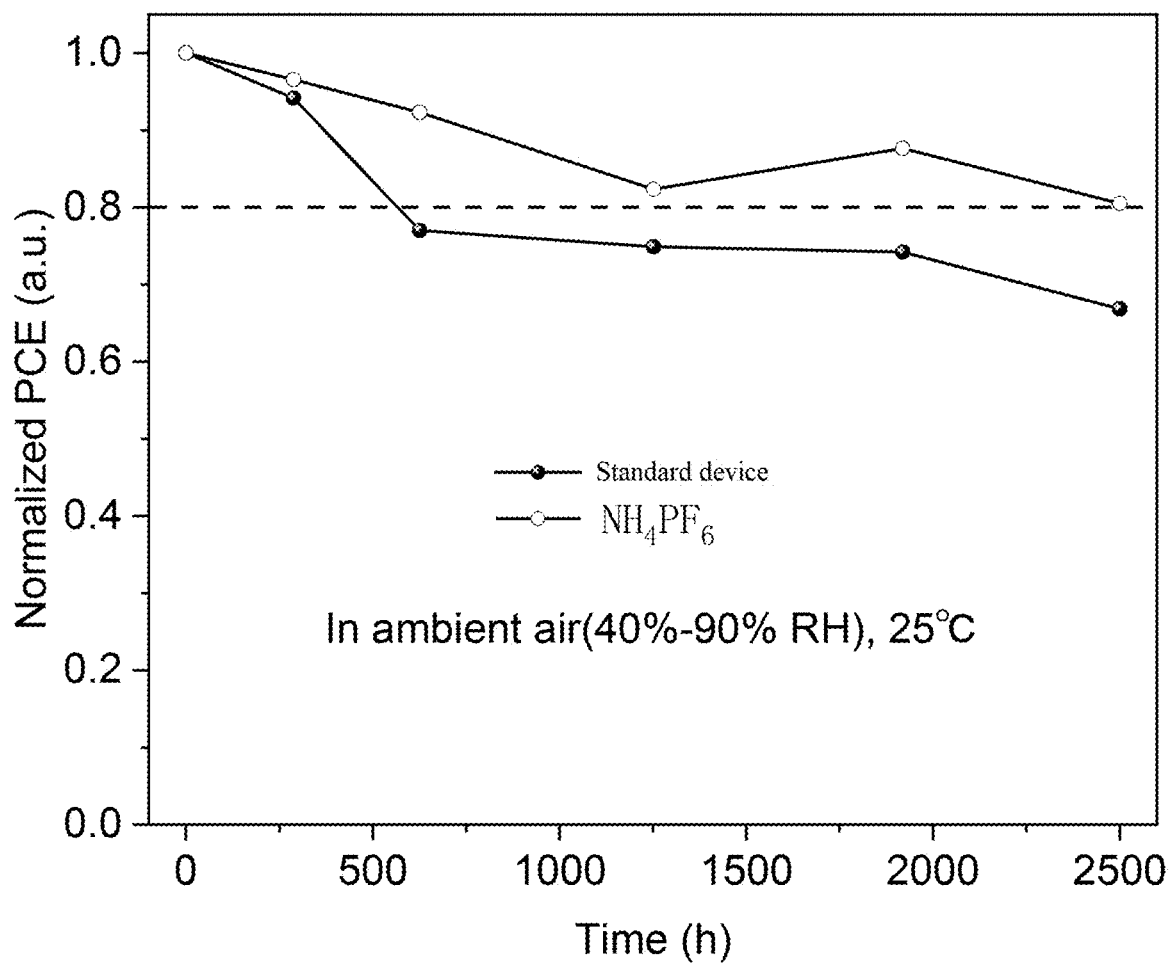
FIG. 5 illustrates a schematic diagram of stability variation curves of the PSCs prepared in the embodiment 1 and an embodiment 2 according to the present disclosure when stored in air.

With reference to FIG. 5, it illustrates stability variation curves of the PSCs prepared in the embodiment 1 and an embodiment 2 according to the present disclosure when store in the air without any control (with relative humidity abbreviated as RH of 40% to 90%). Moreover, it can be seen that after the PSCs are placed for 2,500 h, the PSC with the perovskite multi-protective layer can still maintain 81% of the initial efficiency, while the PSC prepared in the embodiment 2 only remains 67% of the initial efficiency.

Figure 6:
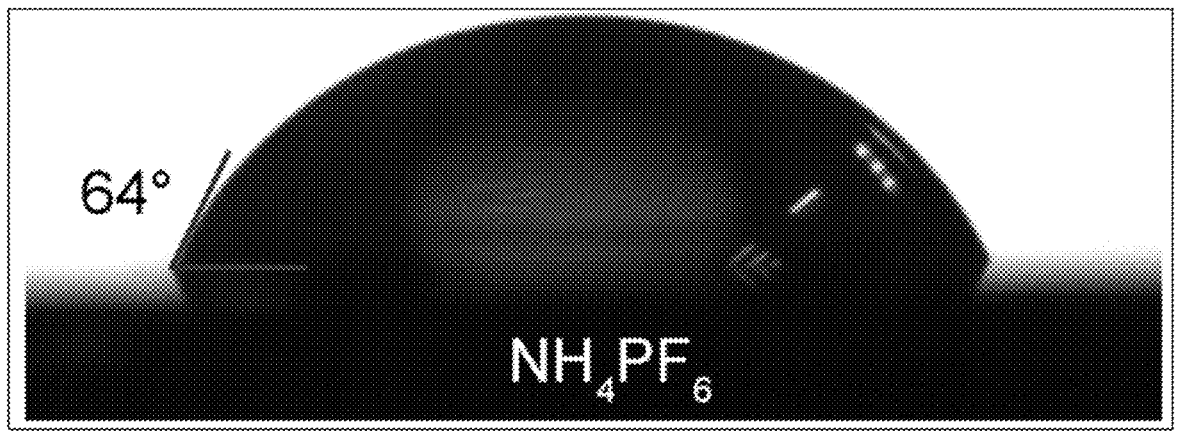
FIG. 6 illustrates a schematic diagram of a contact angle formed between a perovskite multi-protective film prepared in the embodiment 1 according to the present disclosure and water.
Figure 7:
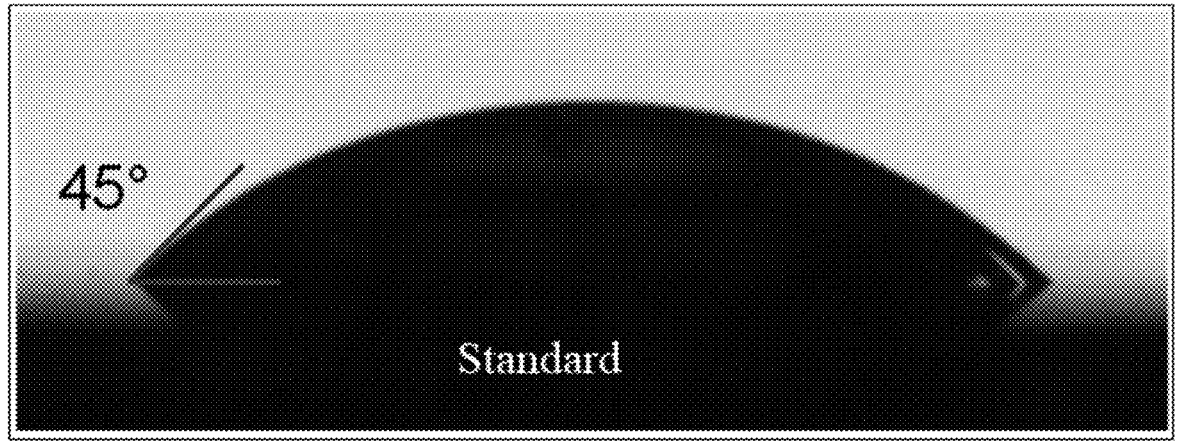
FIG. 7 illustrates a schematic diagram of a contact angle formed between a standard perovskite film without multi-protective layer prepared in the embodiment 2 according to the present disclosure and water.

With reference to FIG. 6 and FIG. 7, they illustrate contact angles formed between the perovskite films prepared in the embodiment 1 (i.e., the perovskite multi-protective layer) and the embodiment 2 (e.g., a standard perovskite layer) according to the present disclosure and water. Moreover, it can be seen that the contact angle (64°) formed between the perovskite multi-protective layer and the water is significantly greater than that of the standard perovskite film (45°).

Figure 8:
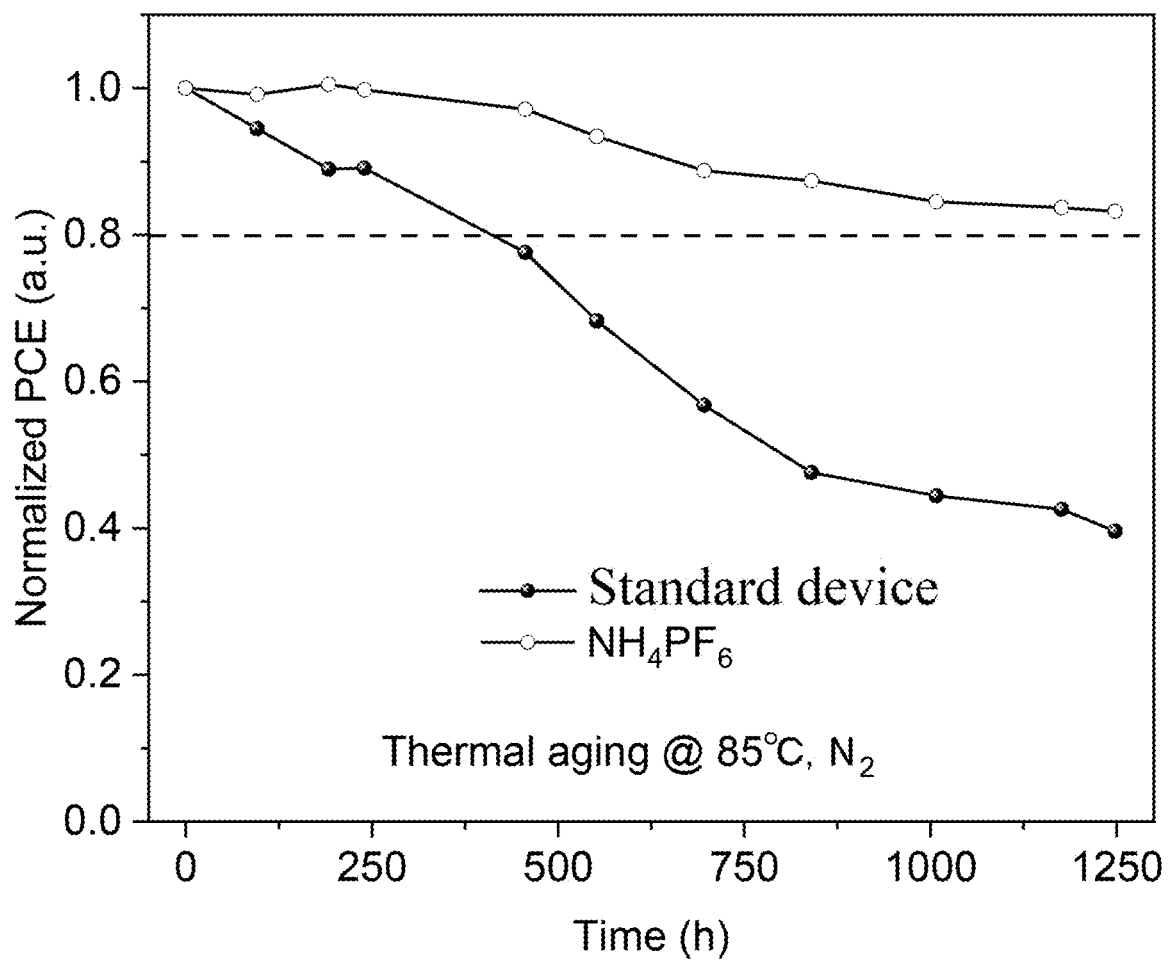
FIG. 8 illustrates a schematic diagram of thermal stability variation curves of the PSCs prepared in the embodiment 1 and the embodiment 2 according to the present disclosure.

With reference to FIG. 8, it illustrates thermal stability variation curves of the PSCs prepared in the embodiment 1 and the embodiment 2 according to the present disclosure at a high temperature of 85° C. (with reference to an international standard "*International Electrotechnical Commission, Terrestrial photovoltaic (PV) modules—Design qualification and type approval-Part 1: Test requirements*", i.e., IEC 61215-1: 201651), and the results show that after performed by the heat aging at 85° C. for 1,248 h, the PSC with the perovskite multi-protective layer can still maintain 83% of the initial efficiency, and the PSC with the standard perovskite film, i.e., without the perovskite multi-protective layer only remains 40% of the initial efficiency.

Figure 9A:
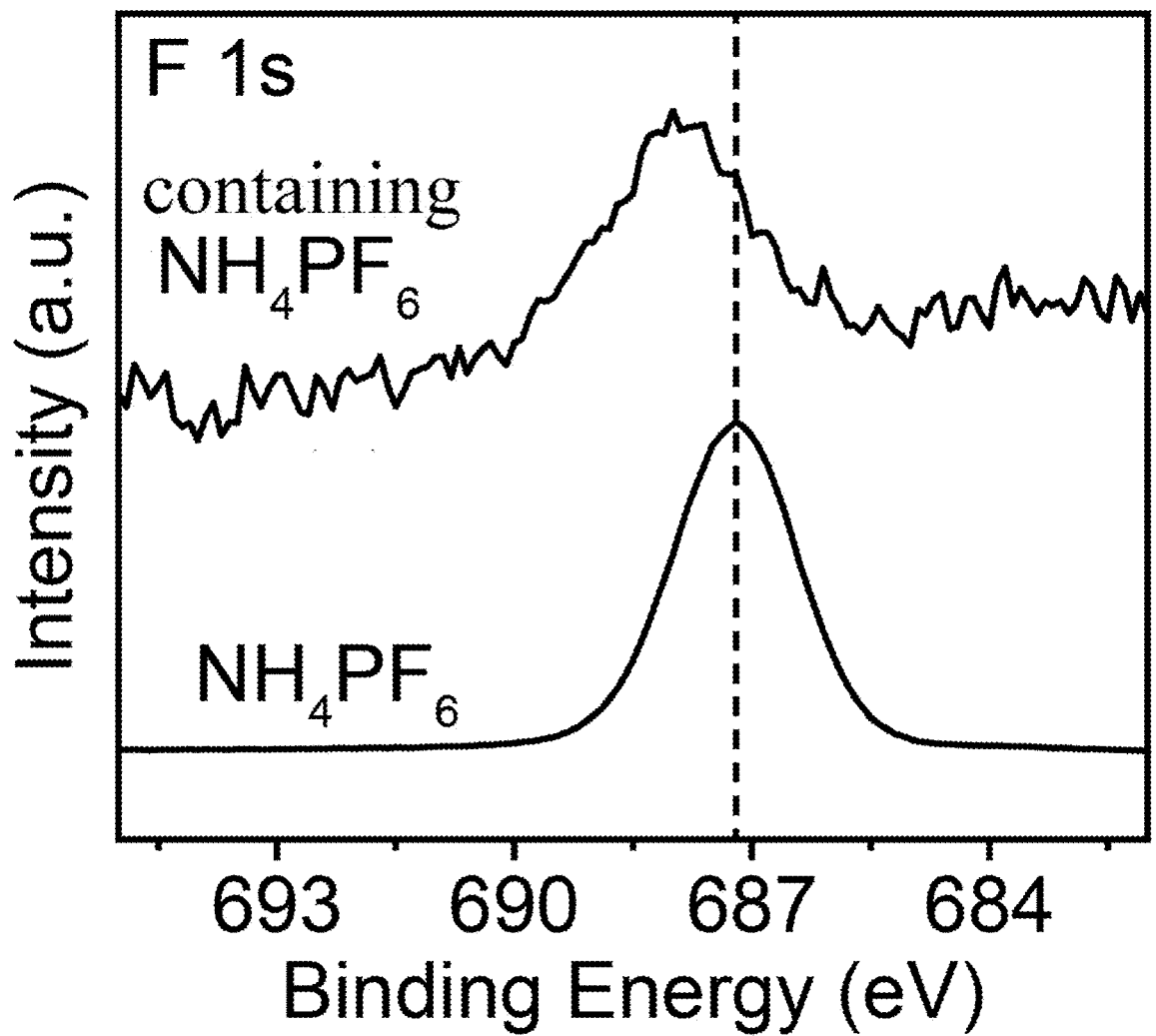
FIGS. 9A to 9B illustrate X-ray photoelectron spectroscopy (XPS) spectra of the perovskite multi-protective film and pure $NH_4PF_6$ prepared in the embodiment 1 and the embodiment 2 according to the present disclosure.
Figure 9B:
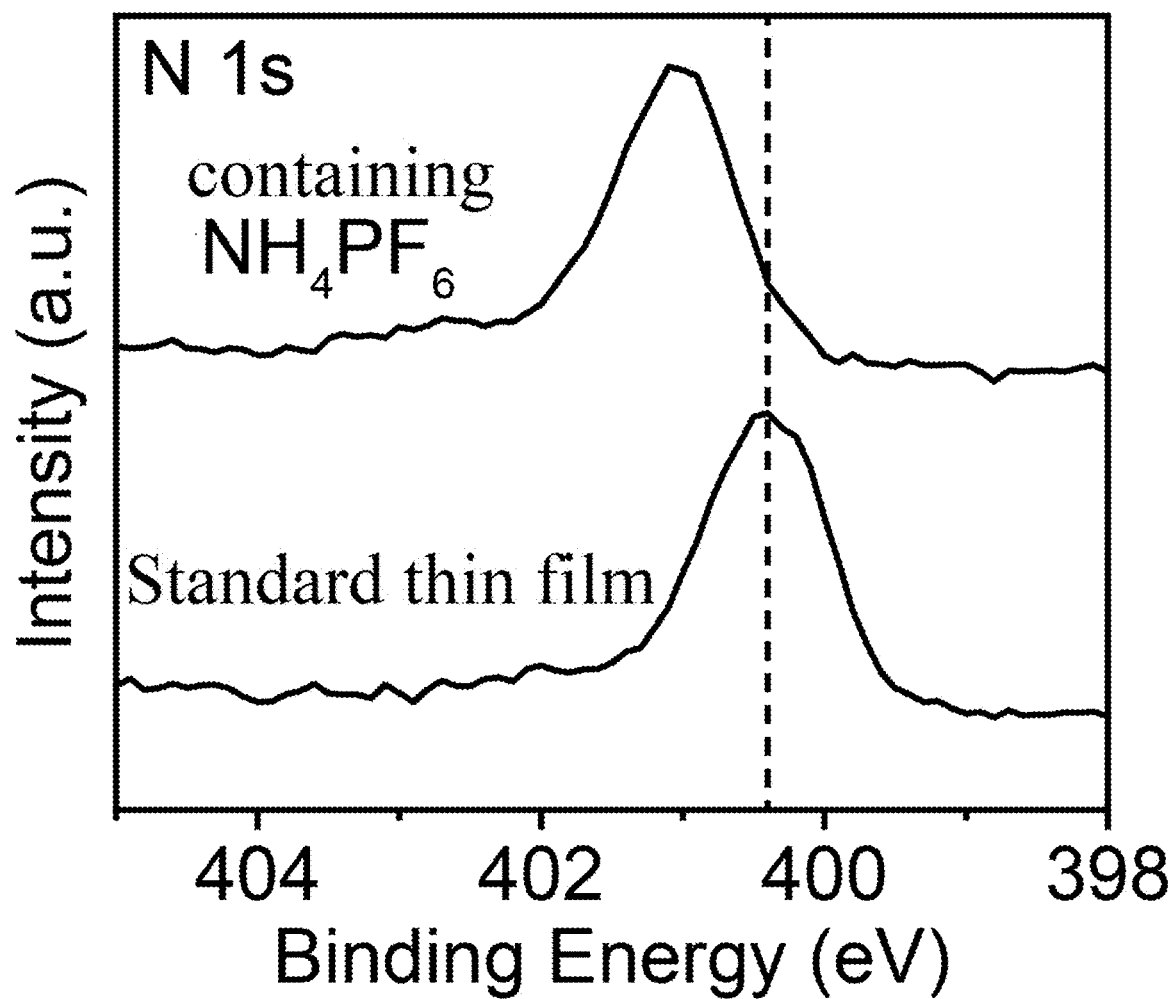

With reference to FIGS. 9A to 9B, they illustrate the perovskite multi-protective layer prepared in the embodiment 1 and the standard perovskite layer prepared in the embodiment 2 according to the present disclosure, which are characterized by X-ray photoelectron spectroscopy (XPS). Moreover, compared with pure $NH_4PF_6$, a fluorine (F) 1 s peak position of the perovskite multi-protective film (also referred to the perovskite multi-protective layer) prepared in the embodiment 1 moves to a high-binding-energy direction, and a nitrogen (N) is peak position of the perovskite multi-protective film prepared in the embodiment 1 also moves to a high-binding-energy direction compared with the perovskite film prepared in the embodiment 2. Moreover, FIGS. 9A to 9B indicate that the $PF_6^-$ contained in the $NH_4PF_6$ and the ion-exchanged perovskite can form F . . . H—N hydrogen bonds with the $MA^+$ contained in perovskite, which inhibits the volatilization of $MA^+$ in the perovskite and improves thermal stability of the device.

Figure 10:
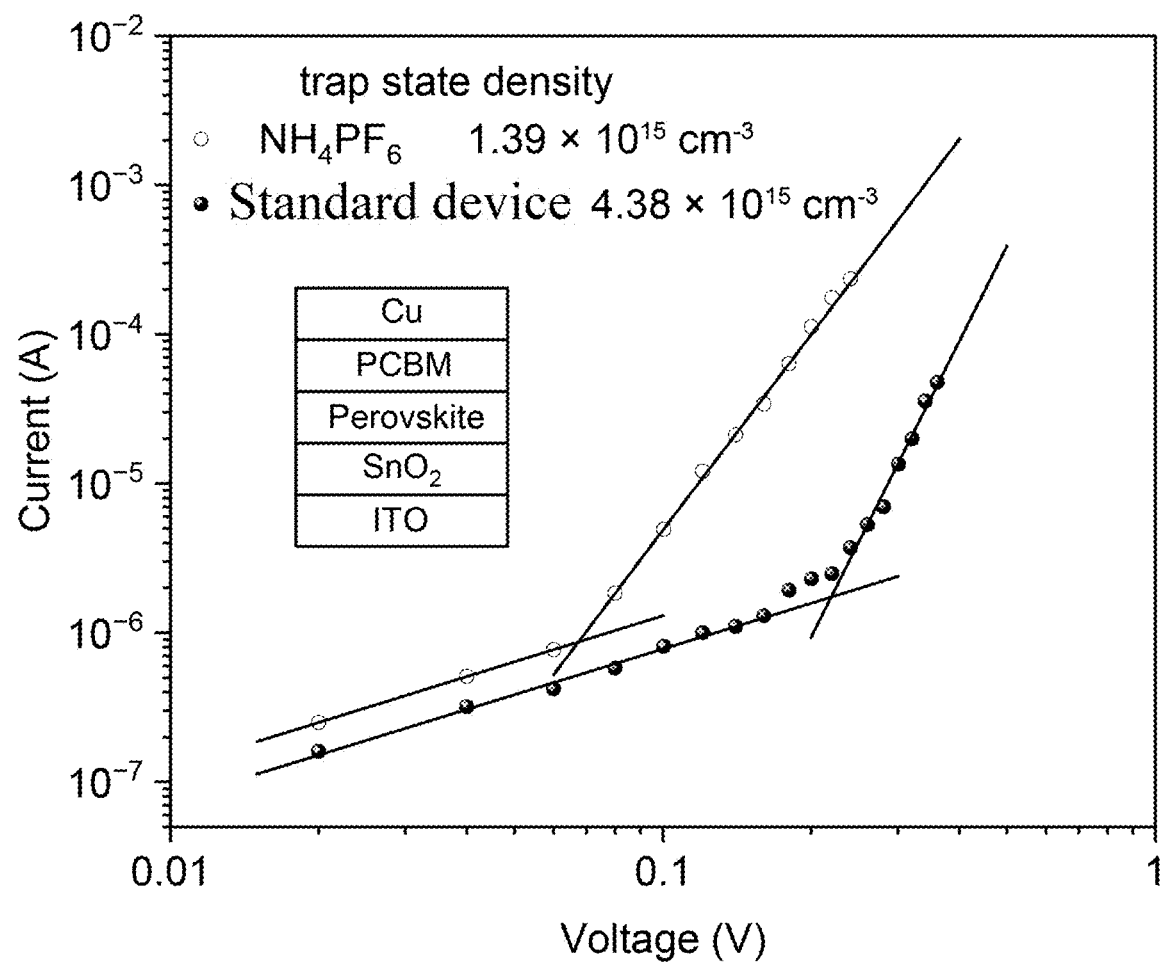
FIG. 10 illustrates a test diagram of space charge limited current of a photovoltaic device prepared by the PSCs prepared in the embodiment 1 and the embodiment 2 according to the present disclosure.

With reference to FIG. 10, it illustrates a test diagram of space charge limited current of a photovoltaic device prepared by the PSCs prepared in the embodiment 1 and the embodiment 2 according to the present disclosure. It can be seen that a trap state density of the obtained photovoltaic device prepared in the embodiment 1 is lower, indicating that the uncoordinated $Pb^{2+}$ contained in the perovskite are anchored with the perovskite multi-protective layer containing the $NH_4PF_6$ to realize the passivation of perovskite defects. In addition, the low-defect high-quality perovskite film provides the third protection for the device, thereby improving the stability of the device under various conditions.

The above characterization proves that compared with the PSC prepared in the embodiment 2, the PSC prepared in the embodiment 1 has a significant improvement in comprehensive photoelectric performance and stability due to the fact that the $NH_4PF_6$ is introduced during preparing the perovskite multi-protective layer, the radius of the $PF_6^-$ is similar to the radius of $I^-$ in the perovskite, the ion exchange reaction can occur during the processes of spin-coating and annealing reaction, the $PF_6^-$ partially replaces the $I^-$ in the perovskite to form the self-protective perovskite light-absorbing layer with the structure of the original perovskite/ion-exchanged perovskite/$NH_4PF_6$ in-situ protective layer, and the perovskite multi-protective layer is subjected to the triple protection from physical and chemical aspects, so that the stability of the device under various conditions, such as storing in the glove boxes, storing in the air, and performed by the heat aging, is remarkably improved, the world-class level is achieved, and the PCE of the prepared PSC is remarkably improved.

Embodiment 3

Figure 11:
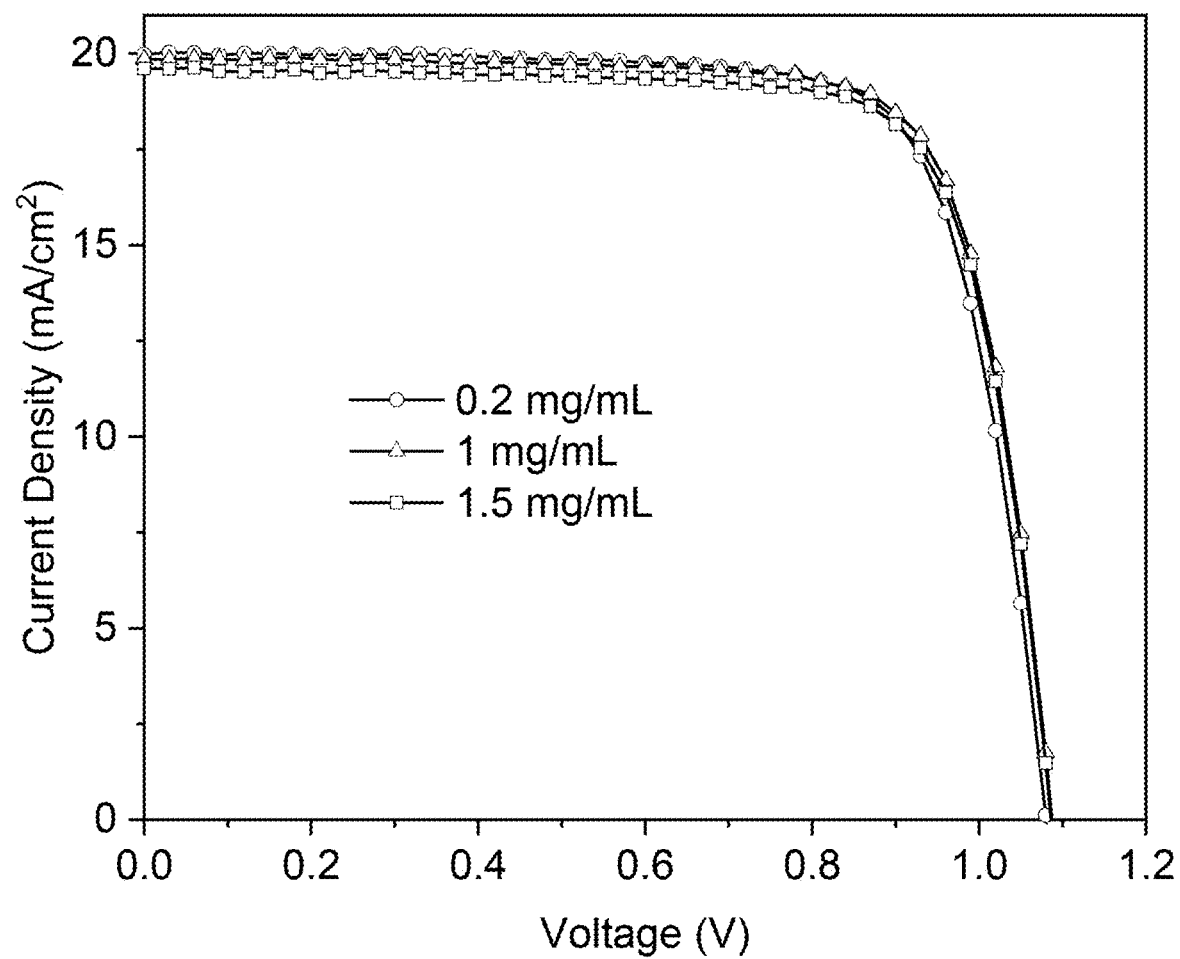
FIG. 11 illustrates a schematic diagram of J-V curves of PSCs prepared in the embodiment 1 and an embodiment 3 according to the present disclosure.

With reference to FIG. 11, it illustrates another embodiment of the present disclosure. In order to verify the beneficial effects of the present disclosure, the present embodiment provides a preparation method of a multi-protected PSC with different concentrations of $NH_4PF_6$. Moreover, the PSC prepared in the present embodiment is compared and tested with the PSC prepared in the embodiment 1, and the test result is compared by means of scientific demonstration to verify the excellent effect of the present preparation method.

The present embodiment differs from the embodiment 1 in that the step 3 is adjusted. Specially, during preparing the perovskite multi-protective layer, the concentrations of the $NH_4PF_6$ solution are 0.2 mg/mL, 1 mg/mL, 1.5 mg/mL respectively, and the remaining steps and the preparation process in the present embodiment are the same as those in the embodiment 1.

The performance of the prepared PSC is compared with that of the PSC prepared in the embodiment 1, and the results are shown in the following Table 2 and FIG. 11.

Table 2 shows a performance comparison table of photovoltaic devices prepared according to the different concentrations of $NH_4PF_6$.

| Concentration | $V_{oc}$/V | $J_{sc}$/mA cm$^{-2}$ | FF/% | PCE/% |
| --- | --- | --- | --- | --- |
| 0.2 mg/mL | 1.08 | 19.98 | 76.21 | 16.45 |
| 1 mg/mL | 1.13 | 21.46 | 79.04 | 19.08 |
| 1.5 mg/mL | 1.09 | 19.61 | 76.60 | 16.34 |

Embodiment 4

Figure 12:
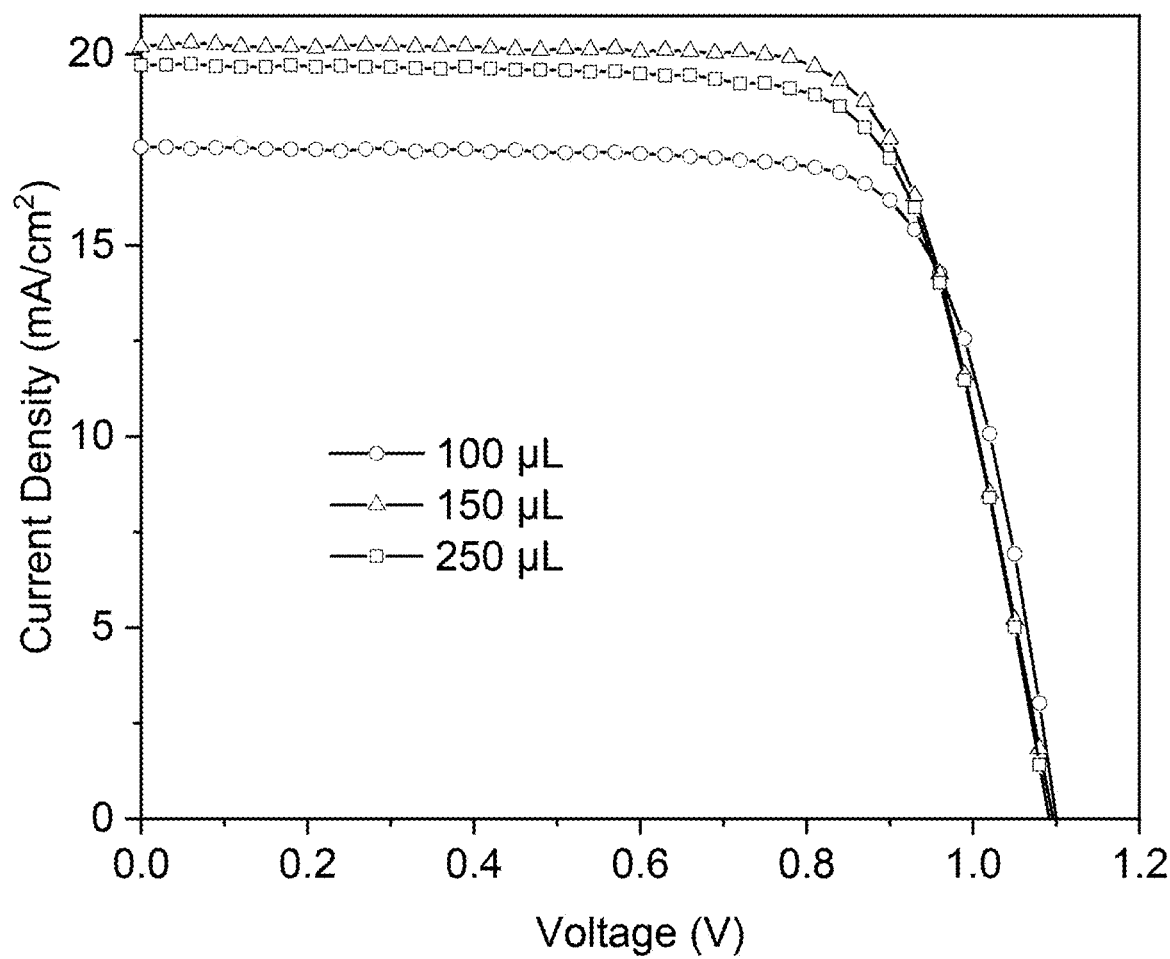
FIG. 12 illustrates a schematic diagram of J-V curves of PSCs prepared in the embodiment 1 and an embodiment 4 according to the present disclosure.

With reference to FIG. 12, it illustrates another embodiment of the present disclosure. In order to verify the beneficial effects of the present disclosure, the present embodiment provides a preparation method of a multi-protected PSC with different addition amounts of anti-solvents of EA (containing the NH$_4$PF$_6$). Moreover, the PSC prepared in the present embodiment is compared and tested with the PSC prepared in the embodiment 1, and the test result is compared by means of scientific demonstration to verify the excellent effect of the present preparation method.

The present embodiment differs from the embodiment 1 in that the step 3 is adjusted. Specially, during preparing the perovskite multi-protective layer, the addition amounts of NH$_4$PF$_6$-EA are 100 μL, 150 μL, 200 μL, respectively, and the remaining steps and the preparation process in the present embodiment are the same as those in the embodiment 1.

The performance of the prepared PSC is compared with that of the PSC prepared in the embodiment 1, and the results are shown in the following Table 3 and FIG. 12.

Table 3 shows a performance comparison table of photovoltaic devices prepared according to the different addition amounts of anti-solvents of EA.

| Addition amount | $V_{oc}$/V | $J_{sc}$/mA cm$^{-2}$ | FF/% | PCE/% |
| --- | --- | --- | --- | --- |
| 100 μL | 1.10 | 17.57 | 75.32 | 14.56 |
| 150 μL | 1.13 | 21.46 | 79.04 | 19.08 |
| 250 μL | 1.09 | 19.72 | 73.11 | 15.74 |

Embodiment 5

Figure 13:
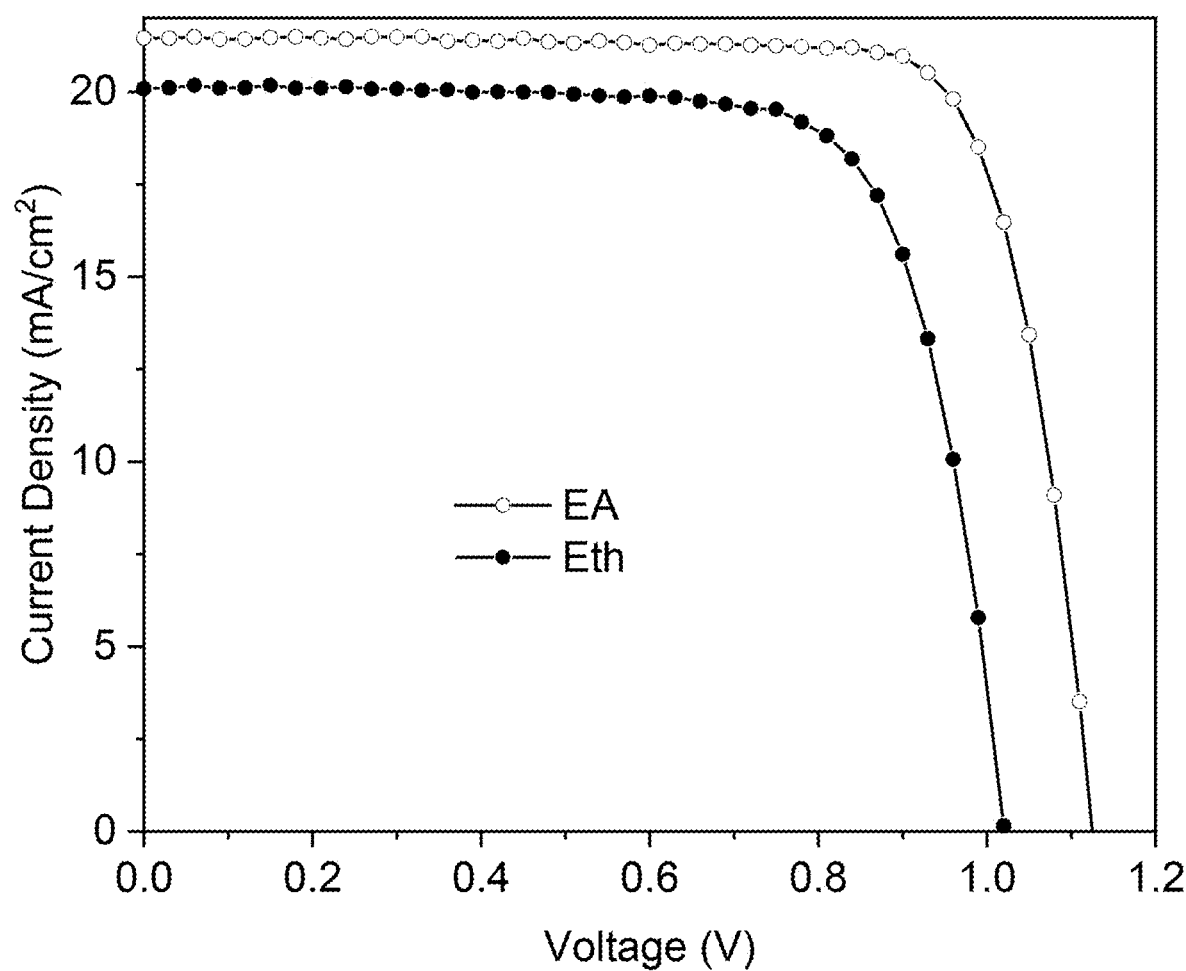
FIG. 13 illustrates a schematic diagram of J-V curves of PSCs prepared in the embodiment 1 and an embodiment 5 according to the present disclosure.

With reference to FIG. 13, it illustrates another embodiment of the present disclosure. In order to verify the beneficial effects of the present disclosure, the present embodiment provides a preparation method of a multi-protected PSC by using different types of anti-solvents (containing the NH$_4$PF$_6$). Moreover, the PSC prepared in the present embodiment is compared and tested with the PSC prepared in the embodiment 1, and the test result is compared by means of scientific demonstration to verify the excellent effect of the present preparation method.

The present embodiment differs from the embodiment 1 in that the step 3 is adjusted. Specially, during preparing the perovskite multi-protective layer, the anti-solvent is determined as Eth, and the remaining steps and the preparation process in the present embodiment are the same as those in the embodiment 1.

The performance of the prepared PSC is compared with that of the PSC prepared in the embodiment 1, and the results are shown in the following Table 4 and FIG. 13.

Table 4 shows a performance comparison table of photovoltaic devices prepared by different types of anti-solvents.

| Anti-solvent type | $V_{oc}$/V | $J_{sc}$/mA cm$^{-2}$ | FF/% | PCE/% |
| --- | --- | --- | --- | --- |
| EA | 1.13 | 21.46 | 79.04 | 19.08 |
| Eth | 1.02 | 17.86 | 74.52 | 13.58 |

As shown in Table 2 to Table 4 and FIG. 11 to FIG. 13, in order to verify the beneficial effects of the present disclosure, various parameters for preparing the perovskite multi-protective layer are adjusted. Specially, it can be seen that only the perovskite multi-protective layer is made from the NH$_4$PF$_6$, the anti-solvent is determined as the EA, the concentration of the NH$_4$PF$_6$ is 1 mg/mL, and the addition amount of the anti-solvent is 150 μL, the obtained photovoltaic device has the best performance, and has excellent long-acting stability while maintaining excellent photoelectric properties.

In summary, in the strategy of the perovskite multi-protective layer provided by the present disclosure, the dense in-situ multifunctional protection layer of NH$_4$PF$_6$ provides the first protection for the perovskite. Specially, the hydrophobic NH$_4$PF$_6$, on the one hand, can block water and oxygen from permeating into the perovskite to protect the perovskite and improve the air stability of the prepared PSC, on the other hand, the NH$_4$PF$_6$ can also form the hydrogen bonds with the perovskite to inhibit the volatilization of MA$^+$ in the perovskite at the high temperature, thereby improving the thermal stability.

The ion-exchanged perovskite layer provides the second protection for the perovskite. Specially, the ion-exchanged perovskite layer becomes hydrophobic due to the introduction of PF$_6^-$, which blocks the permeation of moisture into the perovskite, protects the perovskite, and improves the air stability of the PSC. In addition, the F element contained in the PF$_6^-$ may also form the hydrogen bond with the N element of the MA in the perovskite, further block the volatilization of the MA$^+$ and improve the thermal stability of the PSC.

The high-quality perovskite film provides the third protection for itself. Specially, the NH$_4$PF$_6$ in the present disclosure contains a Lewis acid-base group, which can bond with the uncoordinated Pb$^{2+}$ to realize the passivation of the defects, thereby to form the high-quality perovskite film, and at the same time, the substitution of PF$_6^-$ on I$^-$ is autonomously performed by ion exchange, and does not destroy the perovskite crystal structure like the common component engineering.

Compared with the related art, the preparation process of the present disclosure is simple, the materials used in the present disclosure are low in price, the stability of the perovskite is ensured through the triple protection on the physical and chemical aspects, the stability of the final device under various conditions is remarkably improved, the world-class level is achieved, and meanwhile, the PEC of the prepared PSC is also improved.

It should be noted that the above embodiments are only used to illustrate the technical solutions of the present disclosure rather than limit to the present disclosure. Although the present disclosure is described in detail with reference to the illustrated embodiments, it should be understood by those skilled in the related art that modifications or equivalent replacements may be made to the technical solutions of the present disclosure without departing from the spirit and scope of the technical solutions of the present disclosure, which shall fall within the scope disclosed in the present disclosure.

What is claimed is:

1. A perovskite solar cell, characterized in that a structure of the perovskite solar cell comprises: a substrate, an anode layer, a hole-transporting layer, a perovskite multi-protective layer, a composite electron-transporting layer, a hole blocking layer, and a metal cathode layer that are arranged sequentially from bottom to top of the structure of the perovskite solar cell;

wherein the perovskite multi-protective layer comprises: a perovskite light-absorbing layer and a multifunctional protection layer, the perovskite multi-protective layer is configured to improve a stability of the perovskite solar cell through triple protection, and the triple protection comprises: an ion exchange reaction, a hydrophobic effect and hydrogen bonding based on raw materials of the perovskite solar cell, and passivation of perovskite defects; and wherein a preparation method of the perovskite solar cell comprises the following steps:

preparing the anode layer on the substrate by using transparent glass as the substrate, and spin-coating a poly[bis(4-phenyl)(2,4,6-trimethylphenyl)amine] (PTAA) solution on the anode layer to obtain the hole-transporting layer;

spin-coating a perovskite precursor solution on the hole-transporting layer by using a one-step anti-solvent method;

wherein the perovskite precursor solution is prepared by dissolving formamidinium iodide (FAI), methylammonium bromide (MABr), lead(II) bromide ($PbBr_2$), and lead(II) iodide ($PbI_2$) in a mixed solvent of N,N-dimethylformamide (DMF) and dimethyl sulfoxide (DMSO) with a volume ratio of the DMF to the DMSO being 4:1 to obtain a first mixed solution, then dissolving cesium iodide (CsI) in DMSO to obtain a second mixed solution, and mixing the first mixed solution and the second mixed solution before spin-coating the perovskite precursor solution; and a speed of spin-coating the perovskite precursor solution is in a range of 5,000 revolutions per minute (rpm) to 10,000 rpm, and a time for spin-coating the perovskite precursor solution is 55 seconds (s);

dropwise adding an anti-solvent of ethyl acetate (EA) containing ammonium hexafluorophosphate ($NH_4PF_6$) during spin-coating the perovskite precursor solution, wherein a concentration of the $NH_4PF_6$ in the anti-solvent of EA containing $NH_4PF_6$ is 1 milligram per milliliter (mg/mL), a time for dropwise adding the anti-solvent of EA containing the $NH_4PF_6$ is 15 s before finishing spin-coating the perovskite precursor solution, and an addition amount of the anti-solvent of EA is 150 microliters (μL);

placing the hole-transporting layer coated with the perovskite precursor solution on a heating stage for an annealing reaction after finishing spin-coating the perovskite precursor solution, and obtaining the perovskite multi-protective layer after the annealing reaction is finished;

wherein a lower portion of the perovskite multi-protective layer is a perovskite crystal with a composition of $(Cs_{0.05}FA_{0.81}MA_{0.14})Pb(Br_{0.14}I_{0.86})_3$ and an upper portion of the perovskite multi-protective layer is an ion-exchanged perovskite crystal with a composition of $(Cs_{0.05}FA_{0.81}MA_{0.14})Pb(Br_{0.14}I_{0.86-x}(PF_6)_x)_3$ that together constitute the perovskite light-absorbing layer of the perovskite multi-protective layer, and a top surface of the perovskite multi-protective layer is the multifunctional protection layer made from the $NH_4PF_6$;

spin-coating a [6,6]-phenyl C61 butyric acid methyl ester ($PC_{61}BM$) solution on the multifunctional protection layer to obtain a $PC_{61}BM$ layer, and then depositing fullerene ($C_{60}$) on the $PC_{61}BM$ layer to construct the composite electron-transporting layer; and wherein a lower layer of the composite electron-transporting layer is the $PC_{61}BM$ layer, and an upper layer of the composite electron-transporting layer is the $C_{60}$;

evaporating lithium fluoride (LiF) on the composite electron-transporting layer as the hole blocking layer, and then evaporating a metal material on the hole blocking layer to form the metal cathode layer, thereby obtaining the perovskite solar cell.

2. The perovskite solar cell as claimed in claim 1, wherein a reaction temperature for the annealing reaction is in a range of 70 degrees Celsius (° C.) to 120° C., and a reaction time for the annealing reaction is in a range of 5 min to 20 min.

3. The perovskite solar cell as claimed in claim 1, wherein the perovskite solar cell is capable of maintaining long-term stability under various conditions, maintaining 94% and 81% of an initial efficiency of the perovskite solar cell after being placed in a nitrogen-filled glove box and humid air for 14,016 hours (h) and 2,500 h, respectively, and maintaining 83% of the initial efficiency of the perovskite solar cell after performed by heat aging at 85° C. for 1,248 h.

* * * * *